(12) United States Patent
Kaneshiro et al.

(10) Patent No.: US 7,018,704 B2
(45) Date of Patent: Mar. 28, 2006

(54) POLYIMIDE FILM FOR FLEXIBLE PRINTED BOARD AND FLEXIBLE PRINTED BOARD USING THE SAME

(75) Inventors: Hisayasu Kaneshiro, Uji (JP); Kiyokazu Akahori, Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/471,047

(22) PCT Filed: Sep. 27, 2002

(86) PCT No.: PCT/JP02/10117

§ 371 (c)(1),
(2), (4) Date: Sep. 4, 2003

(87) PCT Pub. No.: WO03/030598

PCT Pub. Date: Apr. 10, 2003

(65) Prior Publication Data

US 2004/0081808 A1    Apr. 29, 2004

(30) Foreign Application Priority Data

Sep. 28, 2001    (JP) .............................. 2001-303219

(51) Int. Cl.
  *B32B 15/00*    (2006.01)
  *B32B 7/02*    (2006.01)
  *C08G 63/00*    (2006.01)

(52) U.S. Cl. ........................ 428/209; 428/214; 528/183

(58) Field of Classification Search ...................... None
See application file for complete search history.

(56) References Cited

U.S. PATENT DOCUMENTS 5,432,001 A * 7/1995 Serafini et al. ............. 428/395
2002/0010311 A1 * 1/2002 Edman et al. ............. 528/310

FOREIGN PATENT DOCUMENTS

| EP | 0786928 A1 | 7/1997 |
| JP | 6-6360 B2 | 1/1994 |
| JP | 11-227099 A | 8/1999 |
| JP | 11-298102 A | 10/1999 |
| JP | 2000-299359 A | 10/2000 |

OTHER PUBLICATIONS

International Search Report from Corresponding PCT Application No. PCT/JP02/10117, dated Dec. 24, 2002, 1 page.

* cited by examiner

Primary Examiner—Amir Zarabian
Assistant Examiner—Kiesha Rose
(74) Attorney, Agent, or Firm—Brinks Hofer Gilson & Lione

(57) ABSTRACT

The present invention provides a flexible printed circuit which is free from curl, torsion and warpage due to temperature change and excellent flexural endurance. By using polyimide film having an average coefficient of thermal expansion of $1.0 \times 10^{-5}$ to $2.5 \times 10^{-5}$ cm/cm/° C. in a temperature range of 100° C. to 200° C. and a stiffness value of 0.4 to 1.2 g/cm as the base film for the flexible printed circuit, a flexible printed circuit having excellent thermal dimensional stability and flexural endurance can be prepared.

5 Claims, No Drawings

POLYIMIDE FILM FOR FLEXIBLE PRINTED BOARD AND FLEXIBLE PRINTED BOARD USING THE SAME

RELATED APPLICATIONS

This application is a nationalization of PCT Application No. PCT/JP02/10117 filed Sep. 27, 2002. This application claims priority from Japanese Patent Application No. 2001-303219 filed on Sep. 28, 2001.

1. Technical Field

The present invention relates to a flexible printed circuit which is free from curl, torsion and warpage due to temperature change and also has excellent flexural endurance, and a base film thereof.

2. Background Art

Previously a flexible printed circuit (hereinafter referred to as FPC) has mainly been used in narrow spaces within a camera in a folded form, utilizing its flexibility. Recently, however, flexible printed circuits have come to be used in drive units of floppy disc drives, hard disc drives, copy machines and printers and therefore enhancement of the flexural endurance of flexible printed circuits is required. To enhance the flexibility of the base film, a film made from polyimide having a chemical structure providing high bending property can be used. However, polyimide having high bending property generally has a high coefficient of thermal expansion (CTE), so a flexible printed circuit using the polyimide film as an insulating material has the disadvantage that warpage and curl easily occur. By contrast, when polyimide having a low coefficient of thermal expansion is selected, problems occur such as the film loses flexibility and becomes fragile and the bending property of the obtained FPC decreases.

In light of the above situation, the present invention aims to provide a flexible printed circuit which has excellent thermal dimensional stability and flexural endurance regardless of chemical structure and is free from curl, torsion and warpage due to temperature change without losing ease in handling the base film, and a base film thereof.

DISCLOSURE OF INVENTION

The present invention relates to a polyimide film for a flexible printed circuit, wherein the average coefficient of thermal expansion in the temperature range of 100° C. to 200° C. is $1.0 \times 10^{-5}$ to $2.5 \times 10^{-5}$ cm/cm/° C. and the stiffness value is 0.4 to 1.2 g/cm.

The present invention also relates to the above-mentioned polyimide film for a flexible printed circuit comprising polyimide obtained from diamine containing 4,4'-oxydianiline and paraphenylenediamine in a mole ratio of 9/1 to 4/6.

The present invention also relates to a flexible printed circuit comprising an adhesive layer and/or a conductor layer and an insulation material, characterized in that the insulation material is the above-mentioned polyimide film.

Furthermore, the present invention relates to a flexible printed circuit, wherein the number of flexes is at least 10 million times

BEST MODE FOR CARRYING OUT THE INVENTION

The polyimide film for a flexible printed circuit and a flexible printed circuit using the same of the present invention are described below based on one example of the embodiments.

It is important for the polyimide film of the present invention to adjust the stiffness value to 0.4 to 1.2. The inventors of the present invention found that the flexural endurance of a film is related to the stiffness value and when the value is 0.4 to 1.2, the film has excellent flexural endurance.

The stiffness value is determined by k×(film thickness)³× (elastic modulus of the film) (k is a proportional constant). These values can be determined so that the stiffness value becomes 0.4 to 1.2, but the film thickness is preferably 17 to 25 µm, more preferably 17 to 23 µm and most preferably 18 to 22 µm. In the case that the film thickness is above the range, the flexural endurance is likely to decrease. In the case that the thickness is below the range, ease in handling the film is likely to decrease.

In the present invention, the film thickness is defined as follows.

In the cases of both a long sheet film and a sheet type film, the film is randomly cut out into the size of a sample for a flexural endurance experiment (180×25 mm) defined by JPCA-FC01 and the thickness is the average of ten points measured in equal intervals in the longitudinal direction from the central area by a contact thickness meter.

When the film thickness fulfills the following equation (1), preferable results regarding flexural endurance can be obtained.

$$X_{max} - X_{min} = aX_{ave} \qquad (1)$$

$X_{max}$: the maximum value of the 10 points
$X_{min}$: the minimum value of the 10 points
$X_{ave}$: the average value of the 10 points In the equation, 'a' is at most 0.3, preferably at most 0.2 and further preferably at most 0.1.

Furthermore, the elastic modulus of the film is preferably 350 to 600 kg/mm², more preferably 380 to 550 kg/mm², further preferably 400 to 500 kg/mm², most preferably 400 to 450 kg/mm². In the case that the elastic modulus is below the range, warpage tends to develop in the FPC. In the case that the elastic modulus is above the range, the average coefficient of thermal expansion in the temperature range of 100° to 200° C. can be out of the preferable range.

The polyimide film for a flexible printed circuit of the present invention, for example, can be prepared by flow casting an organic solvent solution of polyamide acid, which is a precursor of polyimide, onto a supporting body such as an endless belt or stainless drum, then drying and imidizing.

As a process of preparing the polyamide acid used in the present invention, known processes can be used. Polyamide acid is usually produced by a process comprising dissolving substantially equimolar amounts of at least one kind of aromatic tetracarboxylic dianhydride and at least one kind of diamine in an organic solvent, and then stirring the obtained polyamide acid organic solvent solution under a controlled temperature until polymerization of the above-mentioned acid dianhydride and the diamine is completed. This polyamide acid solution is obtained usually in a concentration of 5 to 35% by weight, preferably 10 to 30% by weight. When the concentration is within the range, a suitable molecular weight and solution viscosity can be obtained.

As the process for polymerization, any known process can be used and the following are examples of particularly preferable processes for polymerization. That is, there are processes such as:

1) A process comprising dissolving aromatic diamine in an organic polar solvent and then polymerizing by reacting the solution with a substantially equimolar amount of aromatic tetracarboxylic dianhydride, 2) A process comprising reacting an aromatic tetracarboxylic dianhydride and an aromatic diamine compound of a much smaller molar amount compared to the dianhydride in organic polar solvent, producing a pre-polymer having an acid anhydride group at both ends and then polymerizing by using an aromatic diamine compound so that substantially equimolar amounts of the aromatic tetracarboxylic dianhydride and the aromatic diamine compound are used in total, 3) A process comprising reacting an aromatic tetracarboxylic dianhydride and an aromatic diamine compound of a much larger molar amount compared to the dianhydride in an organic polar solvent, producing a pre-polymer having an amino group at both ends and then after additionally adding an aromatic diamine compound, polymerizing by using an aromatic tetracarboxylic dianhydride so that substantially equimolar amounts of the aromatic tetracarboxylic dianhydride and the aromatic diamine compound are used in total, 4) A process comprising dissolving and/or dispersing an aromatic tetracarboxylic dianhydride in an organic polar solvent and then polymerizing by adding an aromatic diamine compound so that substantially equimolar amounts of aromatic tetracarboxylic dianhydride and the aromatic diamine compound are used in total, 5) A process of polymerizing by reacting a mixture containing substantially equimolar amounts of an aromatic tetracarboxylic dianhydride and an aromatic diamine in an organic polar solvent.

These processes can be selected suitably according to the desired properties.

Below, the materials used for the polyamide acid which is a precursor of polyimide in the present invention are described.

Examples of the acid anhydrides suitable for preparing the polyimide of the present invention include pyromellitic dianhydride, 2,3,6,7-naphthalenetetracarboxylic dianhydride, 3,3',4,4'-biphenyltetracarboxylic dianhydride, 1,2,5,6-naphtalenetetracarboxylic dianhydride, 2,2'3,3'-biphenyltetracarboxylic dianhydride, 3,3',4,4'-benzophenonetetracarboxylic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic dianhydride, bis(3,4-dicarboxyphenyl)sulfonic dianhydride, p-phenylenebis(trimellitic monoester acid anhydride), ethylenebis(trimellitic acid monoester acid anhydride), bisphenolAbis(trimellitic acid monoester acid anhydride) and the like. These compounds can be used alone or in a mixture of any proportion.

Among these, the most suitable acid dianhydride for the polyamide acid composition which is a precursor of polyimide of the present invention, is pyromellitic acid dianhydride. The amount of pyromellitic acid dianhydride is at least 40% by mole, more preferably at least 50% by mole, further preferably at least 70% by mole and most preferably at least 80% by mole.

Examples of the diamine which may suitably be used for the polyamide acid compound which is a precursor of polyimide of the present invention include 4,4'-oxydianiline, p-phenylenediamine, 4,4'-diaminodiphenylpropane, 4,4'-diaminodiphenylmethane, benzidine, 3,3'-dichlorobenzidine, 4,4'-diaminodiphenylsulfide, 3,3'-diaminodiphenylsulfon, 4,4'-diaminodiphenylsulfon, 4,4'-diaminodiphenylether, 3,3'-diaminodiphenylether, 3,4'-diaminodiphenylether, 1,5-diaminonaphthalene, 4,4'-diaminodiphenyldiethylsilane, 4,4'-diaminodiphenylsilane, 4,4'-diaminodiphenylethylphosphineoxide, 4,4'-diaminodiphenyl-N-methylamine, 4,4'-diaminodiphenyl-N-phenylamine, 1,4-diaminobenzene (p-phenylenediamine), 1,3-diaminobenzene, 1,2-diaminobenzene and the like. Among these diamine compounds, preferably 4,4'-oxydianiline and p-phenylenediamine are used in a molar ratio of 9/1 to 4/6, more preferably 8/2 to 5/5. In the case that the molar ratio of these two diamines is out of the range, the coefficient of thermal expansion becomes larger and problems may occur such as the film becomes fragile and the flexural endurance decreases.

In the present invention, means to enhance flexural endurance are controlled by the stiffness value, so both the coefficient of thermal expansion and flexural endurance can be obtained. That is, the coefficient of thermal expansion and flexural endurance can both be obtained by determining the elastic modulus and film thickness so that the stiffness value is 0.4 to 1.2, and by selecting a chemical composition so that the coefficient of thermal expansion is suitable for a flexible printed circuit. Therefore polyamide acid can be synthesized by a common process by suitably selecting a known acid dianhydride and diamine component, preferably from the above-mentioned acid dianhydrides and diamine components, so that the coefficient of thermal expansion becomes 1.0 to $2.5 \times 10^{-5}$ cm/cm/° C.

Examples of the solvent preferable for synthesizing polyamide acid are amide solvents, such as N,N-dimethylformamide (DMF), N,N-dimethylacetamide and N-methyl-2-pyrrolidone and more preferably, N,N-dimethylformamide and N,N-dimethylacetamide can be used.

Also, various organic additives, inorganic fillers and various reinforcement materials can be added when needed.

As for the process of producing polyimide film from the above-mentioned polyamide acid solution, a conventionally known process can be used. Examples of the process include thermal imidization and chemical imidization, and chemical imidization is more preferable in view of thermal dimensional stability and mechanical strength. The chemical cure process is a process of reacting polyamide acid organic solvent solution with a dehydrating agent of which acid anhydrides such as acetic anhydride are typical and an imidization catalyst of which tertiary amines such as isoquinoline, P-picoline and pyridine are typical. Chemical imidization and thermal imidization can be used together. Although the heating conditions may change depending on the type of polyamide acid used and the film thickness, adjusting the heating time and temperature so that the propagation tear strength of the film defined by ASTM D-1938 becomes 140 to 360 g/mm, more preferably 160 to 320 g/mm, most preferably 200 to 300 g/mm is preferable in that the flexural endurance of the film can be enhanced.

In this way, a polyimide film can be obtained which has an average coefficient of thermal expansion at 100° to 200° C. of 1.0 to $2.5 \times 10^{-5}$cm/cm/° C., preferably 1.0 to $2.0 \times 10^{-5}$ cm/cm/° C., more preferably 1.3 to $1.8 \times 10^{-5}$ cm/cm/° C. and also a stiffness value of 0.4 to 1.2 g/cm, preferably 0.4 to 0.8 g/cm and more preferably 0.5 to 0.7 g/cm.

In the case that the average coefficient of thermal expansion at 100° to 200° C. is out of the above-mentioned range, FPC is likely to warp or curl, which is undesirable. Also, in the case that the stiffness value is below the above-mentioned range, especially when the film is thin, handling the film tends to become difficult due to floppiness, and in the case that the stiffness value is above the range, the flexural endurance tends to decrease. In the case that the stiffness value is within the above-mentioned range, the flexural endurance is enhanced.

The flexible printed circuit of the present invention can be obtained by laminating a conductor on the above-mentioned polyimide film.

Examples of the process for forming a conductor layer on the polyimide film are:

1) A process comprising laminating a layer of metal foil such as copper on the polyimide film by methods such as lamination or pressing via an adhesive layer,
2) A process comprising forming a conductor layer directly on the polyimide film by plating, vacuum deposition or sputtering
3) A process comprising applying polyimide or polyamide acid on Cu foil and then imidizing and/or drying.

In the case that an adhesive agent is used to laminate the conductor on the above-mentioned polyimide film in the flexible printed circuit of the present invention, the adhesive agent used include acrylic type, modified phenolic type, polyimide type and nylon-epoxy type, but is not limited to these examples.

The above-mentioned adhesive agent has an elastic modulus after curing of preferably at least 1 GPa, more preferably at least 1.5 GPa, and further preferably at least 2 GPa. Also, the thickness of the adhesive layer is preferably at most 60 µm, more preferably at most 50 µm and further preferably at most 40 µm. In the case that the elastic modulus and the thickness of the adhesive layer are out of the ranges, the number of flexes tends to decrease.

The thickness of the metal foil used is preferably at most 50 µm, more preferably 35 µm and further preferably 18 µm. In the case that the thickness of the metal foil is above the range, the number of flexes tends to decrease.

Furthermore, a particularly preferable result can be obtained in the case of a combination, in which the thickness of the metal foil is at most 18 µm, the elastic modulus of the adhesive agent is at least 2 GPa, the elastic modulus of the polyimide base film is 400 to 450 kg/mm$^2$ and the thickness of the polyimide base film is 18 to 22 µm.

In this way, a flexible printed circuit can be obtained in which the number of flexes is at least 10 million times, more preferably at least 20 million times, most preferably at least 40 million times.

The present invention is explained in detail through Examples below, but the present invention is not limited thereto.

Properties were measured in the following manner.

<Coefficient of Thermal Expansion>

Apparatus: TMA8140 made by Rigaku Electronic Corporation

Temperature profile: 20° to 400° C.

Heating rate: 10° C./min

Sample size: 5×20 mm

In order to remove the influence of shrinkage by heat, measurements were repeated twice at the above-mentioned temperature profile and then the average coefficient of thermal expansion at 100° to 200° C. was calculated from the second chart.

<Stiffness>

Measurements were carried out using a loop stiffness tester made by Toyo Seiki Works Co., Ltd by a sample width of 10 mm, a loop length of 50 mm and a squash distance of 10 mm.

<Film Thickness>

The film obtained is randomly cut out into the size of a sample for a flexural endurance experiment (180×25 mm) defined by JPCA-FC01 and the thickness was measured at ten points in equal intervals in the longitudinal direction from the central area by a contact thickness meter. The average of the obtained measured value $X_{ave}$ was assumed to be the film thickness.

<Propagation Tear Strength of the Film>

The propagation tear strength (g/mm) of the obtained film was measured according to ASTM D-1938.

<Number of Flexes>

A specimen was prepared according to JPCA-FC01. A FPC bending testing device "SEK-31B4" made by Shin-Etsu Engineering KK was used as the testing device and the sample was placed with the cover lay film side upward and measured under conditions of a curvature radius of 0.25 mm, stroke width of 15 mm, testing rate of 1500 rotations/minute and supply current of 1 mA. When the resistance value became 150% of the initial resistance value, it was determined that disconnection had occurred and value of less than 1 million was rounded off and the value was assumed to be the number of flexes.

REFERENCE EXAMPLE 1

Preparation of FPC

A copper-clad laminate was obtained by laminating rolled copper foil to a base film using an acrylic adhesive (Pyralux available from Dupont Co., Ltd., elastic modulus 2.3 GPa) (15 µm thickness). A circuit pattern was formed on the copper layer of the copper-clad laminate by etching according to JPCA-FC01. Then, a cover lay obtained by applying the above adhesive (35 µm thickness) on the exact same film as the base film was placed on the above copper-clad laminate having a circuit pattern and a flexible printed circuit (FPC) was obtained.

EXAMPLES 1, 2, 5 AND 6

A curing agent comprising 20 g of acetic anhydride and 10 g of isoquinoline was mixed to 100 g of a 18% by weight DMF solution of polyamide acid synthesized using pyromellitic dianhydride, 4,4'-oxydianiline and p-phenylenediamine in a mole ratio of 4/3/1. After stirring and defoaming by centrifugation, the mixture was applied by flow casting onto aluminum foil. Stirring and defoaming were conducted while cooling to 0° C. The laminate of the aluminum foil and polyamide acid solution was heated at 120° C. for 150 seconds and a gel film having self supportiveness was obtained. The gel film was peeled from the aluminum foil and fixed in a frame. The gel film was heated at 300° C., 400° C. and 500° C. respectively for 30 seconds and a polyimide film having an average coefficient of thermal expansion at 100° to 200° C. of $1.6 \times 10^{-5}$ cm/cm/° C. was prepared. Using this film, a FPC was obtained according to Reference Example 1. The properties of the film and the FPC are shown in Table 1.

EXAMPLES 3, 4, 7 AND 8

A curing agent comprising 20 g of acetic anhydride and 10 g of isoquinoline was mixed to 100 g of a 18% by weight DMF solution of polyamide acid synthesized using pyromellitic dianhydride, 4,4'-oxydianiline and p-phenylenediamine in a mole ratio of 3/2/1. After stirring and defoaming by centrifugation, the mixture was applied by flow casting onto aluminum foil. Stirring and defoaming were conducted while cooling to 0° C. The laminate of the aluminum foil and polyamide acid solution was heated at 120° C. for 150 seconds and a gel film having self supportiveness was obtained. The gel film was peeled from the aluminum foil and fixed in a frame. The gel film was heated at 300° C., 400° C. and 500° C. respectively for 30 seconds and a polyimide film having an average coefficient of thermal expansion at 100° to 200° C. of $1.3 \times 10^{-5}$ cm/cm/° C. was prepared. Using this film, a FPC was obtained according to Reference Example 1. The properties of the film and the FPC are shown in Table 1.

EXAMPLE 9

A FPC was obtained from the polyimide film prepared in Example 1 in the same manner as in Reference Example 1 except that a modified phenolic adhesive (9Y601 available from Kanebo NSC Co., Ltd, elastic modulus 8.4 GPa) was used instead of the acrylic adhesive. The properties of the film and the FPC are shown in Table 1.

EXAMPLE 10

A FPC was obtained from the polyimide film prepared in Example 3 in the same manner as in Reference Example 1 except that a modified phenolic adhesive (9Y601 available from Kanebo NSC Co., Ltd, elastic modulus 8.4 GPa) was used instead of the acrylic adhesive. The properties of the film and the FPC are shown in Table 1.

EXAMPLE 11

A polyimide film and FPC were obtained in the same manner as in Example 5 except that the gel film was heated at 300° C., 400° C. and 520° C. respectively for 30 seconds.

EXAMPLE 12

A polyimide film and FPC were obtained in the same manner as in Example 7 except that the gel film was heated at 300° C., 400° C. and 520° C. respectively for 30 seconds.

COMPARATIVE EXAMPLE 1

A curing agent comprising 20 g of acetic anhydride and 10 g of isoquinoline was mixed to 100 g of a 18% by weight DMF solution of polyamide acid synthesized using pyromellitic dianhydride and 4,4'-oxydianiline in a mole ratio of 1/1. After stirring and defoaming by centrifugation, the mixture was applied by flow casting onto aluminum foil. Stirring and defoaming were conducted while cooling to 0° C. The laminate of the aluminum foil and polyamide acid solution was heated at 120° C. for 150 seconds and a gel film having self supportiveness was obtained. The gel film was peeled from the aluminum foil and fixed in a frame. The gel film was heated at 300° C., 400° C. and 500° C. respectively for 30 seconds and a polyimide film having an average coefficient of thermal expansion at 100° to 200° C. of $3.1 \times 10^{-5}$ cm/cm/° C. was prepared. Using this film, a FPC was obtained according to Reference Example 1. The properties of the film and the FPC are shown in Table 1.

COMPARATIVE EXAMPLE 2

A polyimide film was prepared in the same manner as in Examples 1 and 2 except that the flow casting thickness was changed. Using this film, a FPC was obtained according to Reference Example 1. The properties of the film and the FPC are shown in Table 1.

TABLE 1

| | Base Film | | | | | | | FPC | | | |
|---|---|---|---|---|---|---|---|---|---|---|---|
| | $X_{ave}$ (μm) | $X_{max}$ (μm) | $X_{min}$ (μm) | a | Propagation tear strength (g/mm) | Elastic modulus (kg/mm$^2$) | Loop stiffness (g/cm) | Ease in handling film when processing | Copper foil thickness (μm) | Number of flexes (10,000 times) | Appearance |
| Ex. 1 | 21 | 22 | 20 | 0.095 | 240 | 420 | 0.7 | good | 35 | 1800 | good |
| Ex. 2 | 21 | 23 | 20 | 0.14 | 240 | 420 | 0.7 | good | 18 | 3200 | good |
| Ex. 3 | 21 | 22 | 20 | 0.095 | 220 | 467 | 0.8 | good | 35 | 1900 | good |
| Ex. 4 | 21 | 22 | 19 | 0.14 | 220 | 467 | 0.8 | good | 18 | 3500 | good |
| Ex. 5 | 18 | 20 | 17 | 0.17 | 220 | 420 | 0.5 | good | 35 | 2100 | good |
| Ex. 6 | 18 | 20 | 17 | 0.17 | 220 | 420 | 0.5 | good | 18 | >4000 | good |
| Ex. 7 | 18 | 19 | 17 | 0.11 | 200 | 467 | 0.5 | good | 35 | 2300 | good |
| Ex. 8 | 18 | 18 | 17 | 0.056 | 200 | 467 | 0.5 | good | 18 | >4000 | good |
| Ex. 9 | 21 | 22 | 20 | 0.095 | 240 | 420 | 0.7 | good | 18 | >4000 | good |
| Ex. 10 | 21 | 23 | 20 | 0.14 | 220 | 467 | 0.8 | good | 18 | >4000 | good |
| Ex. 11 | 18 | 19 | 17 | 0.11 | 190 | 430 | 0.5 | good | 35 | 1800 | good |
| Ex. 12 | 18 | 20 | 17 | 0.17 | 180 | 470 | 0.5 | good | 35 | 2000 | good |
| Com. Ex. 1 | 20 | 22 | 17 | 0.25 | 260 | 320 | 0.3 | bad | 35 | 1300 | warpage |
| Com. Ex. 2 | 30 | 33 | 28 | 0.17 | 290 | 425 | 1.9 | good | 35 | 800 | good |

INDUSTRIAL APPLICABILITY

The present invention provides a flexible printed circuit which has excellent thermal dimensional stability and flexural endurance and is free from curl, torsion and warpage due to temperature change, and a base film thereof.

The invention claimed is:

1. A polyimide film for flexible printed circuit, having an average coefficient of thermal expansion of $1.0 \times 10^{-5}$ to $2.5 \times 10^{-5}$ cm/cm/° C. in temperature range of 100° C. to 200° C. and a stiffness value of 0.4 to 1.2 g/cm where the polyimide is obtained from diamine containing 4,4'-oxydianiline and paraphenylenediamine in a mole ratio of 9/1 to 4/6.

2. A flexible printed circuit comprising an adhesive layer and/or a conductor layer and an insulation material, wherein the polyimide film of claim 1 is used as said insulation material.

3. The flexible printed circuit of claim 2 having a number of flexes of at least 10 million times.

4. A flexible printed circuit comprising an adhesive layer and/or a conductor layer and an insulation material, wherein the polyimide film of claim 1 is used as said insulation material.

5. The flexible printed circuit of claim 4 having a number of flexes of at least 10 million times.

* * * * *

(12) INTER PARTES REEXAMINATION CERTIFICATE (1267th)
United States Patent
Kaneshiro et al.

(10) Number: US 7,018,704 C1
(45) Certificate Issued: May 12, 2016

(54) POLYIMIDE FILM FOR FLEXIBLE PRINTED BOARD AND FLEXIBLE PRINTED BOARD USING THE SAME

(75) Inventors: Hisayasu Kaneshiro, Uji (JP); Kiyokazu Akahori, Otsu (JP)

(73) Assignee: Kaneka Corporation

Reexamination Request:
No. 95/001,707, Aug. 15, 2011

Reexamination Certificate for:
Patent No.: 7,018,704
Issued: Mar. 28, 2006
Appl. No.: 10/471,047
PCT Filed: Sep. 27, 2002
PCT No.: PCT/JP02/10117
§ 371 (c)(1),
(2), (4) Date: Sep. 4, 2003
PCT Pub. No.: WO03/030598
PCT Pub. Date: Apr. 10, 2003

(30) Foreign Application Priority Data

Sep. 27, 2001 (JP) ................................ 2001-303219

(51) Int. Cl.
*B32B 15/00* (2006.01)
*B32B 7/02* (2006.01)
*C08G 63/00* (2006.01)
*C08G 73/10* (2006.01)
*H05K 1/03* (2006.01)

(52) U.S. Cl.
CPC .......... *H05K 1/0346* (2013.01); *C08G 73/1071* (2013.01); *H05K 2201/0154* (2013.01); *Y10T 428/24917* (2015.01); *Y10T 428/24959* (2015.01); *Y10T 428/31721* (2015.04)

(58) Field of Classification Search
None
See application file for complete search history.

(56) References Cited

To view the complete listing of prior art documents cited during the proceeding for Reexamination Control Number 95/001,707, please refer to the USPTO's public Patent Application Information Retrieval (PAIR) system under the Display References tab.

*Primary Examiner* — Alan Diamond

(57) ABSTRACT

The present invention provides a flexible printed circuit which is free from curl, torsion and warpage due to temperature change and excellent flexural endurance. By using polyimide film having an average coefficient of thermal expansion of $1.0 \times 10^{-5}$ to $2.5 \times 10^{-5}$ cm/cm/° C. in a temperature range of 100° C. to 200° C. and a stiffness value of 0.4 to 1.2 g/cm as the base film for the flexible printed circuit, a flexible printed circuit having excellent thermal dimensional stability and flexural endurance can be prepared.

INTER PARTES REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-5 are cancelled.

\* \* \* \* \*